United States Patent
Hsu et al.

(10) Patent No.: US 9,046,424 B2
(45) Date of Patent: *Jun. 2, 2015

(54) THROTTLING MEMORY IN A COMPUTER SYSTEM

(75) Inventors: Pochang Hsu, Fremont, CA (US); Animesh Mishra, Pleasanton, CA (US); Jun Shi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 201 days.

This patent is subject to a terminal disclaimer.

(21) Appl. No.: 12/495,510

(22) Filed: Jun. 30, 2009

(65) Prior Publication Data

US 2009/0262783 A1  Oct. 22, 2009

Related U.S. Application Data

(60) Continuation of application No. 11/924,754, filed on Oct. 26, 2007, now Pat. No. 7,553,075, which is a division of application No. 10/852,923, filed on May 24, 2004, now Pat. No. 7,304,905.

(51) Int. Cl.
*G11C 7/04* (2006.01)
*G01K 7/00* (2006.01)
(Continued)

(52) U.S. Cl.
CPC ............ *G01K 13/00* (2013.01); *G06F 1/206* (2013.01); *G06F 1/3203* (2013.01); *G06F 13/16* (2013.01); *G11C 5/04* (2013.01); *G11C 5/143* (2013.01); *G11C 7/04* (2013.01); *Y02B 60/1275* (2013.01)

(58) Field of Classification Search
CPC ........... G11C 11/406; G11C 11/40626; G11C 11/40618; G11C 11/4091; G11C 16/26; G11C 2211/4068; G11C 11/00
USPC ......... 374/100, 112, 137, 141, 29, 4, 57, 170, 374/178, 183, 185; 327/512, 513, 541; 702/133–136, 139, 130; 365/211, 212, 365/189.02, 230.02, 233, 72, 63, 51; 700/299, 79; 711/105
See application file for complete search history.

(56) References Cited

U.S. PATENT DOCUMENTS

| | | |
|---|---|---|
| 4,843,026 A | 6/1989 | Ong et al. |
| 5,787,462 A | 7/1998 | Hafner et al. |

(Continued)

FOREIGN PATENT DOCUMENTS

| | | |
|---|---|---|
| CN | 1957318 A | 5/2007 |
| EP | 1754131 A2 | 2/2007 |

(Continued)

OTHER PUBLICATIONS

"OA Mailed May 31, 2006 for U.S. Appl. No. 10/852,923", (May 31, 2006), Whole Document.

(Continued)

*Primary Examiner* — Gail Kaplan Verbitsky
(74) *Attorney, Agent, or Firm* — Jordan IP Law, LLC

(57) ABSTRACT

Systems and methods of managing memory devices provide for reduced power consumption and better thermal management through enhanced memory throttling. In one embodiment a memory unit includes a memory device and a temperature measurement module coupled to the memory device. The temperature measurement device measures the internal temperature of the memory device. Memory throttling can therefore be implemented based on more accurate measurements and with a much shorter response time.

15 Claims, 2 Drawing Sheets

(51) Int. Cl.
| | |
|---|---|
| G01K 13/00 | (2006.01) |
| G06F 1/20 | (2006.01) |
| G06F 1/32 | (2006.01) |
| G06F 13/16 | (2006.01) |
| G11C 5/04 | (2006.01) |
| G11C 5/14 | (2006.01) |

(56) References Cited

U.S. PATENT DOCUMENTS

| | | | |
|---|---|---|---|
| 5,809,547 A | 9/1998 | Taoda | |
| 5,835,963 A | 11/1998 | Yoshioka et al. | |
| 5,897,663 A * | 4/1999 | Stancil | 711/200 |
| 5,918,982 A | 7/1999 | Nagata et al. | |
| 6,008,685 A * | 12/1999 | Kunst | 327/512 |
| 6,020,834 A | 2/2000 | Rider | |
| 6,021,076 A | 2/2000 | Woo et al. | |
| 6,047,373 A | 4/2000 | Hall et al. | |
| 6,112,164 A * | 8/2000 | Hobson | 702/132 |
| 6,122,733 A | 9/2000 | Christeson et al. | |
| 6,256,731 B1 | 7/2001 | Hall et al. | |
| 6,283,628 B1 * | 9/2001 | Goodwin | 374/1 |
| 6,314,503 B1 | 11/2001 | D'Errico et al. | |
| 6,324,620 B1 | 11/2001 | Christenson et al. | |
| 6,373,768 B2 * | 4/2002 | Woo et al. | 365/211 |
| 6,452,790 B1 * | 9/2002 | Chu et al. | 361/679.52 |
| 6,453,218 B1 * | 9/2002 | Vergis | 700/299 |
| 6,507,530 B1 * | 1/2003 | Williams et al. | 365/226 |
| 6,567,763 B1 | 5/2003 | Javanifard et al. | |
| 6,611,911 B1 | 8/2003 | O'Shea et al. | |
| 6,662,136 B2 * | 12/2003 | Lamb et al. | 702/132 |
| 6,757,857 B2 * | 6/2004 | Lamb et al. | 714/740 |
| 6,809,978 B2 | 10/2004 | Alexander et al. | |
| 6,836,704 B2 * | 12/2004 | Walsh | 700/299 |
| 6,870,357 B1 | 3/2005 | Falik | |
| 6,888,763 B1 | 5/2005 | Guo | |
| 6,895,483 B2 | 5/2005 | Eguchi et al. | |
| 6,941,432 B2 | 9/2005 | Ronstrom | |
| 6,955,164 B2 | 10/2005 | Kesler et al. | |
| 6,963,959 B2 | 11/2005 | Hsu et al. | |
| 7,032,070 B2 | 4/2006 | Kodama | |
| 7,035,159 B2 | 4/2006 | Janzen et al. | |
| 7,050,959 B1 * | 5/2006 | Pollard et al. | 703/21 |
| 7,064,994 B1 * | 6/2006 | Wu | 365/211 |
| 7,099,735 B2 | 8/2006 | Jain et al. | |
| 7,135,913 B2 * | 11/2006 | Min et al. | 327/541 |
| 7,260,007 B2 * | 8/2007 | Jain et al. | 365/212 |
| 7,266,031 B2 | 9/2007 | Kim et al. | |
| 7,281,846 B2 * | 10/2007 | McLeod | 374/178 |
| 7,304,905 B2 * | 12/2007 | Hsu et al. | 365/212 |
| 7,404,071 B2 * | 7/2008 | Janzen et al. | 713/1 |
| 7,412,614 B2 | 8/2008 | Ku | |
| 7,450,456 B2 * | 11/2008 | Jain et al. | 365/212 |
| 7,454,586 B2 * | 11/2008 | Shi et al. | 711/167 |
| 7,480,792 B2 * | 1/2009 | Janzen et al. | 713/1 |
| 7,545,617 B2 * | 6/2009 | Foster, Sr. | 361/103 |
| 7,553,075 B2 * | 6/2009 | Hsu et al. | 374/141 |
| 7,765,825 B2 * | 8/2010 | Wyatt | 62/259.2 |
| 8,042,999 B2 * | 10/2011 | Jeong et al. | 374/170 |
| 8,590,332 B2 * | 11/2013 | Wyatt | 62/259.2 |
| 2001/0014049 A1 * | 8/2001 | Woo et al. | 365/211 |
| 2001/0026576 A1 | 10/2001 | Beer et al. | |
| 2002/0059539 A1 | 5/2002 | Anderson | |
| 2002/0180543 A1 | 12/2002 | Song et al. | |
| 2003/0060934 A1 * | 3/2003 | Walsh | 700/299 |
| 2003/0076125 A1 * | 4/2003 | McCord | 324/765 |
| 2003/0103402 A1 | 6/2003 | Tran et al. | |
| 2003/0145194 A1 | 7/2003 | O'Shea et al. | |
| 2003/0158696 A1 | 8/2003 | Gold et al. | |
| 2003/0177293 A1 | 9/2003 | Bilak et al. | |
| 2003/0185058 A1 | 10/2003 | LeClerg | |
| 2003/0210506 A1 | 11/2003 | Edmonds et al. | |
| 2004/0141370 A1 | 7/2004 | Tran et al. | |
| 2004/0215912 A1 * | 10/2004 | Vergis et al. | 711/170 |
| 2004/0267984 A1 | 12/2004 | Fukushima et al. | |
| 2005/0050279 A1 | 3/2005 | Chiu et al. | |
| 2005/0081010 A1 | 4/2005 | DeWitt | |
| 2005/0216221 A1 * | 9/2005 | Broyles et al. | 702/132 |
| 2005/0246558 A1 * | 11/2005 | Ku | 713/300 |
| 2006/0146629 A1 * | 7/2006 | Lee | 365/222 |
| 2006/0221741 A1 | 10/2006 | Jain et al. | |
| 2006/0239095 A1 | 10/2006 | Shi et al. | |
| 2006/0265615 A1 | 11/2006 | Janzen et al. | |
| 2007/0211548 A1 * | 9/2007 | Jain et al. | 365/211 |
| 2008/0043556 A1 * | 2/2008 | Nale | 365/212 |
| 2008/0137256 A1 * | 6/2008 | Foster | 361/103 |
| 2008/0186562 A2 * | 8/2008 | Moskowitz | 359/296 |
| 2010/0001786 A1 * | 1/2010 | Ramachandran et al. | 327/524 |
| 2011/0054714 A1 * | 3/2011 | Santos et al. | 700/299 |

FOREIGN PATENT DOCUMENTS

| | | |
|---|---|---|
| SG | 126564 | 11/2006 |
| TW | I319137 B | 1/2010 |
| WO | 2005/116800 A2 | 12/2005 |
| WO | 2005/116800 A3 | 2/2006 |

OTHER PUBLICATIONS

"FOA Mailed Apr. 9, 2007 for U.S. Appl. No. 10/852,923", (Apr. 9, 2007), Whole Document.
"NALL mailed Jul. 19, 2007 for U.S. Appl. No. 10/852,923", (Jul. 19, 2007), Whole Document.
"OA Mailed Feb. 21, 2008 for U.S. Appl. No. 11/924,754", (Feb. 21, 2008), Whole Document.
"FOA mailed Oct. 1, 2008 for U.S. Appl. No. 11/924,754", (Oct. 1, 2008), Whole document.
"NALL mailed Feb. 23, 2009 for U.S. Appl. No. 11/924,754", (Feb. 23, 2009), Whole document.
"OA mailed Oct. 6, 2006 for U.S. Appl. No. 10/922,737", (Oct. 6, 2006), Whole document.
"FOA mailed Jun. 4, 2007 for U.S. Appl. No. 10/922,737", (Jun. 4, 2007), Whole document.
"Advisory Action mailed Oct. 25, 2007 for U.S. Appl. No. 10/922,737", (Oct. 25, 2007), Whole document.
"OA mailed Feb. 21, 2008 for U.S. Appl. No. 10/922,737", (Feb. 21, 2008), Whole document.
"OA mailed Jul. 31, 2008 for U.S. Appl. No. 10/922,737", (Jul. 31, 2008), Whole document.
"NALL mailed Dec. 8, 2008 for U.S. Appl. No. 10/922,737", (Dec. 8, 2008), Whole document.
"International Report on Patentability mailed Dec. 7, 2006 for PCT/US2005/015886", (Dec. 7, 2006), Whole document.
"International Search Report and Written Opinion mailed Dec. 15, 2005 for PCT/US2005/015886", (P19162PCT), (Dec. 15, 2005), Whole Document.
Microsoft, "Microsoft Computer Dictionary, Fifth Edition", *Microsoft Press*, Redmond, WA, (2002), 458.
Patent Office of PRC, "Notice of Grant for Chinese Application No. 200580016090.2", with translation, (Aug. 8, 2008), Whole document.
Patent Office of PRC, "Office Action for Chinese Patent Application No. 200580016090.2", with translation, (Mar. 21, 2008), Whole document.
Patent Office of PRC, "Office Action for Chinese Patent Application No. 200580016090.2", (Dec. 14, 2007), Whole document.
Extended European Search Report for Application No. 12156944.6-1245, mailed May 22, 2012, six pages.

* cited by examiner

THROTTLING MEMORY IN A COMPUTER SYSTEM

RELATED PATENT APPLICATION

This application is a continuation of U.S. patent application Ser. No. 11/924,754, filed on Oct. 26, 2007 and issued on Jun. 30, 2009, as U.S. Pat. No. 7,553,075; which is a division of U.S. patent application Ser. No. 10/825,923, filed May 24, 2004, issued on Dec. 4, 2007, as U.S. Pat. No. 7,304,905, the entire contents of which are hereby incorporated by reference herein.

BACKGROUND

1. Technical Field

Embodiments of the present invention generally relate to memory devices. More particularly, embodiments relate to throttling memory in a computer system.

2. Discussion

While recent trends in the computer industry toward smaller computing platforms and greater functionality have been desirable to consumers, these trends have presented a number of challenges to computer system designers as well as manufacturers. For example, designing notebook personal computers (PCs), personal digital assistants (PDAs) and wireless "smart" phones can be quite difficult due to the small form factor of these systems and their susceptibility to component overheating. In particular, excessive temperatures can cause processors, memory devices and other components to operate at a less than optimum performance level. In some cases, overheating can cause device failure. Overheating can also cause safety concerns with regard to the surface temperature of the platform enclosure. In addition, the applications being designed for computer systems continue to demand an increasing amount of power, which has a direct effect on temperature. For example, 3D gaming applications and "always-on" wireless features are just a sampling of the types of relatively high power applications available to consumers. When such applications are incorporated into small form factor computer systems, thermal concerns increase even more.

To better manage the above-described concerns, many computer designers establish a thermal design power (TDP) limit for a given platform, where the TDP essentially defines a power threshold that the platform should operate below in order to minimize overheating-related performance losses and safety concerns. In particular, it has been determined that accesses to memory units such as system memory can contribute significantly to the power consumption of the overall system. To address this problem, some solutions involve incorporating a temperature sensor into a memory controller hub (MCH), where the MCH controls accesses to the memory unit over a memory bus. If the temperature of the MCH exceeds a pre-set value, the memory unit is "throttled" by reducing memory access traffic to the memory unit.

While the above-described approach has been suitable under certain circumstances, a number of difficulties remain. For example, the temperature measured within the MCH does not reflect the actual internal temperature of the memory unit. As a result, correlating the measured temperature to the actual temperature can be difficult and may result in inaccuracies. Furthermore, to offset the risk of inaccurate temperature measurement, many designs involve overly conservative temperature limits and are therefore associated with significant performance losses. Another difficulty with the conventional approach relates to response time. In particular, some memory devices such as synchronous dynamic random access memory (SDRAM) devices have relatively high current surge transients that may require immediate shutdown in cases of overheating. The relatively long response time of the conventional approach, however, may not be able to detect the overheating in time because the temperature is measured at the MCH.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Figure 1:
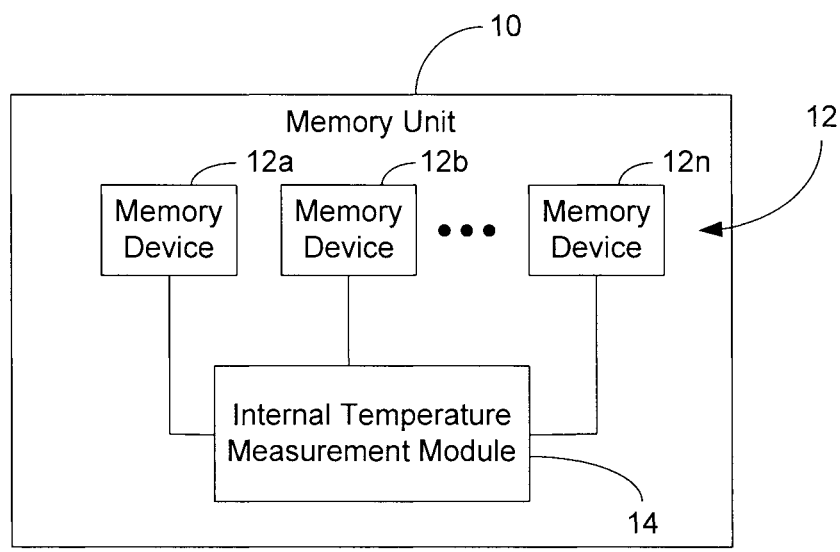
FIG. 1 is a block diagram of an example of a memory unit according to one embodiment of the invention.

FIG. 1 shows a memory unit 10 that provides a number of advantages over conventional memory units. In particular, the memory unit 10 has a plurality of memory devices 12 (12a-12n) and a temperature measurement module 14 coupled to the memory devices 12. As will be discussed in greater below, the memory unit 10 may be a small outline dual inline memory module (SO-DIMM) of the type typically used in notebook personal computers (PCs). The memory unit 10 could also be a micro DIMM, or a full-size DIMM, more commonly used in desktop PCs. Furthermore, the memory devices 12 may be synchronous dynamic random access memory (SDRAM) devices, which have relatively high current surge transients and can therefore be highly susceptible to overheating. While a number of the examples will be described with respect to SO-DIMMs and SDRAM devices, the embodiments of the invention are not so limited. Indeed, any memory device having temperature dependent performance can be used without parting from the nature and spirit of the embodiments described. Notwithstanding, there are a number of aspects of SO-DIMMs and SDRAM devices for which the principles described herein are well suited.

The illustrated temperature measurement module 14 measures an internal temperature of each of the memory devices 12. By measuring the internal temperature of the memory devices 12 rather than the internal temperature of a neighboring memory controller hub (MCH, not shown), the temperature measurement module 14 significantly obviates conventional concerns over accuracy and response time. For example, temperature measurements made by the module 14 more accurately reflect the die temperature of the memory devices 12, and can be used to detect overheating much more quickly than conventional temperature measurements.

Figure 2:
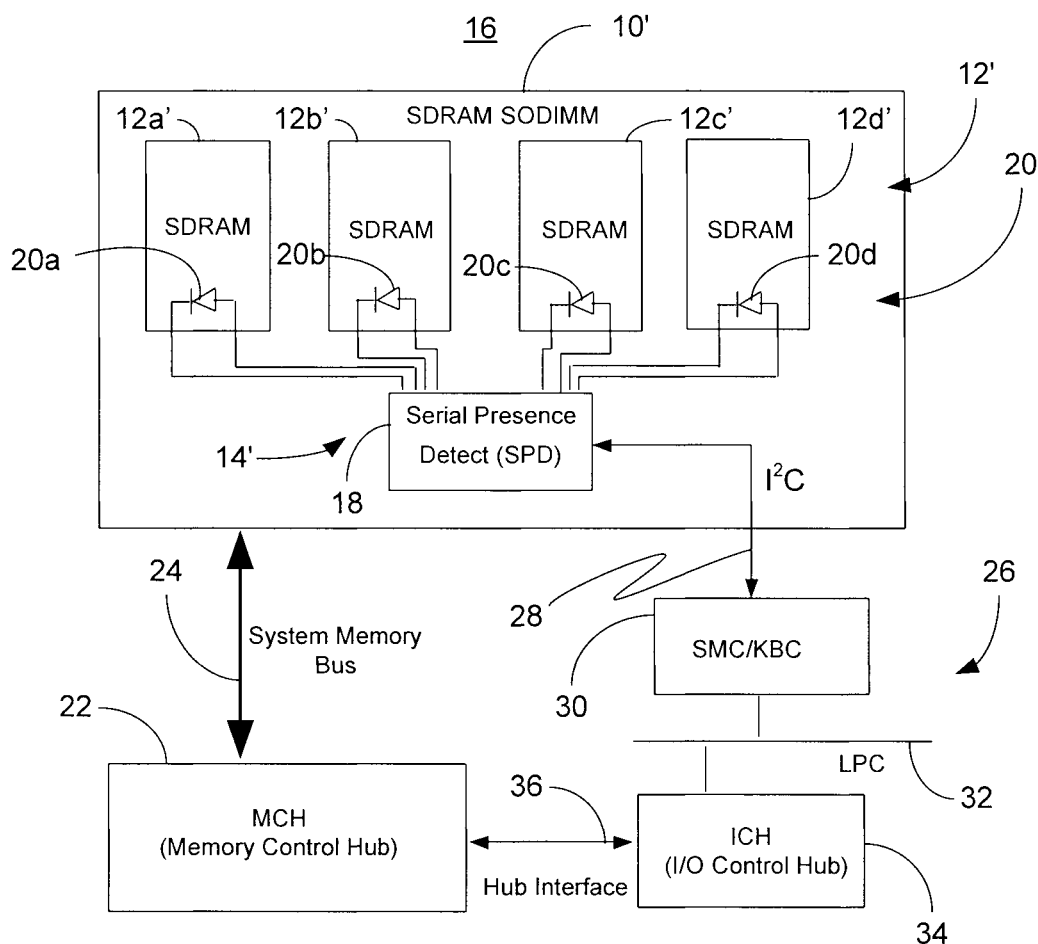
FIG. 2 is a block diagram of an example of a system according to one embodiment of the invention.

Turning now to FIG. 2, one example of a system with an improved memory unit is shown in greater detail at 16. In particular, the system 16 includes a SO-DIMM 10', an MCH 22, a system management interface 26 and a system memory bus 24. The SO-DIMM 10' can have a 144-pin configuration that supports 64-bit transfers, a 72-pin configuration that supports 64-bit transfers, or any other acceptable configuration (see e.g., PC133 SDRAM Unbuffered SO-DIMM, Reference Design Specification, Version 1.02, JEDEC Standard No. 21-C, October, 2003). The illustrated SO-DIMM 10' has a plurality of SDRAM devices 12' (12a'-12d') and a temperature measurement module 14'. While four SDRAM devices have been shown, a greater or smaller number of memory devices may be used. The temperature measurement module 14' includes a serial presence detect (SPD) device 18 and a plurality of thermal diodes 20 (20a-20d), where each of the thermal diodes 20 is embedded in one of the SDRAM devices 12'.

In addition to storing configuration information (e.g., module size, data width, speed and voltage) used by the basic input/output system (BIOS, not shown) at system start-up, the SPD device 18 is able to transfer internal temperatures of the SDRAM devices 12' to the system management interface 26. The system management interface 26 can generate throttling control signals if the internal temperatures exceed the temperature threshold, where the MCH 22 can reduce memory access traffic to (i.e., throttle) the SO-DIMM 10' in response to the throttling control signals.

In particular, the illustrated system management interface 26 includes a system management bus 28 coupled to the SPD device 18 and a system controller (e.g., system management controller and keyboard controller, SMC/KBC) 30 coupled to the system management bus 28. The system controller 30 receives the internal temperatures from the SPD device 18 over the system management bus 28, compares the internal temperatures to the temperature threshold and generates the throttling control signals if the internal temperatures exceed the temperature threshold.

In one example, the system management bus 28 is an inter integrated circuit ($I^2C$) bus (e.g., $I^2C$ Specification, Version 2.1, Phillips Semiconductors, January 2000), which can physically consist of two active wires and a ground connection. The active wires, termed serial data line (SDA) and serial clock line (SCL) are both bidirectional. In such an approach, each component connected to the bus can act as a receiver and/or transmitter depending on its functionality. In any given transaction, the component acting as a transmitter is considered the bus master and the remaining components are regarded as bus slaves. Thus, the SPD device 18 can function as a bus master and the system controller 30 can function as a bus slave with regard to the transfer of the internal temperatures. In cases where configuration information is being retrieved from an SPD electrically erasable programmable read only memory (EEPROM, not shown) for BIOS purposes, the system controller 30 may act as the bus master and the SPD device 18 may function as the bus slave.

The system management bus 28 can also operate under an SMBus framework (e.g., SMBus Specification, Version 2.0, SBS Implementers Forum, August 200). An SMBus interface uses $I^2C$ as its backbone, and enables components to pass messages back and forth rather than merely tripping individual control lines. Such an approach is particularly useful for memory units such as the SO-DIMM 10', which transfers SPD data to BIOS.

The illustrated system management interface 26 also includes a chipset bus (e.g., Intel® low pin count/LPC Interface Specification, Rev. 1.1, August 2002) 32 coupled to the system controller 30, an input/output controller hub (ICH) 34 coupled the chipset bus 32 and a hub interface 36 coupled to the ICH 34 and the MCH 22. The ICH receives the throttling control signals from the system controller 30 over the chipset bus 32 and forwards the control signals to the MCH 22 over the hub interface 36. As already noted, the MCH 22 is able to throttle the SO-DIMM 10' based on the control signals. In this regard, the system 16 may include other components (not shown) such as processors, graphics controllers, network interfaces, etc., that desire read and/or write access to the SDRAM devices 12' on the SO-DIMM 10' by way of the system memory bus 24 and/or MCH 22.

For example, a graphics controller could be processing a 3-dimensional (3D) gaming application that requires frequent accesses to one or more of the SDRAM devices 12' over the system memory bus 24, where the MCH 22 has the ability to modulate traffic on the system memory bus 24. If the increased activity of the SDRAM devices 12' results in an internal temperature of the SDRAM devices 12' that is above a particular threshold, the system controller 30 generates a throttling initiation signal, which ultimately causes the MCH 22 to restrict memory access traffic on the system memory bus 24. By measuring the more accurate internal temperatures of the SDRAM devices 12', the system 16 is able to implement more aggressive memory throttling. Furthermore, the system 16 is able to react to temperature spikes much more quickly than conventional systems.

Figure 3:
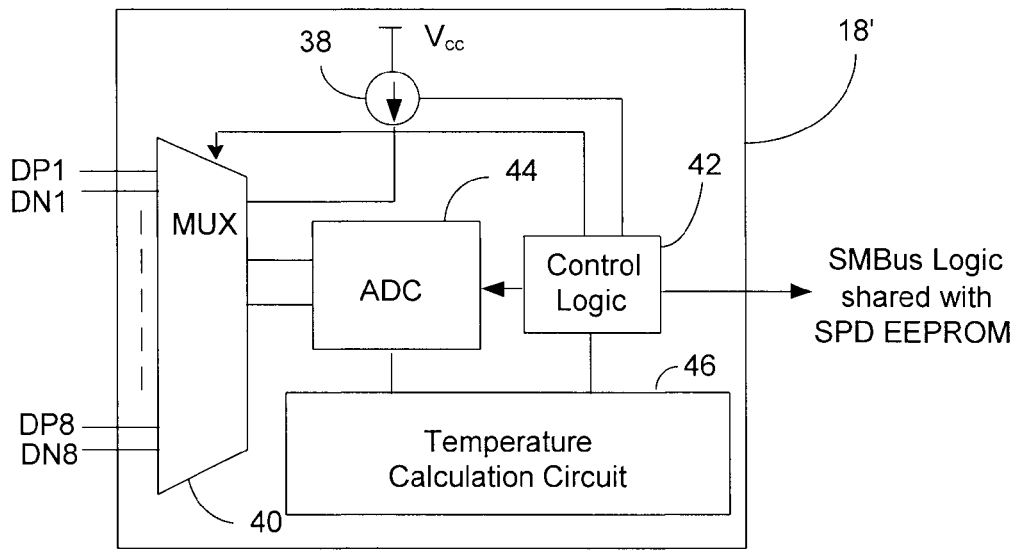
FIG. 3 is a block diagram of an example of a serial presence detect device according to one embodiment of the invention.

Turning now to FIG. 3, one approach to implementing temperature measurement in an SPD device is shown in greater detail at 18'. In particular, the illustrated SPD device 18' includes a current source 38 that injects a pair of measurement signals into each of the thermal diodes 20 (FIG. 2), where the measurement signals result in a temperature dependent voltage differential for each thermal diode. While the current source 38 is shown as being part of the SPD device 18', the current source may also be located elsewhere in the system. Essentially, a first measurement signal having a known current is injected into a given thermal diode, where the first measurement signal results in a first voltage drop across the thermal diode. A second measurement signal also having a known current is then injected into the thermal diode, resulting in a second voltage drop. Since the forward bias current of the thermal diodes is a function of die temperature, the difference between the two voltage drops is also a function of die temperature. For example, the difference may be greater at high die temperatures than at low temperatures. The voltage across the thermal diode for the two measurement signals therefore defines a temperature dependent voltage differential. It should be noted that alternatively, a single measurement signal could be used to obtain an absolute voltage value. Due to the variation in voltage/current characteristics across thermal diodes, however, calibration may be needed to obtain an acceptable level of accuracy under such an approach.

The illustrated SPD device 18' also has a multiplexer 40, which selects between the thermal diodes based on a selection signal from control logic 42. Selection can be in a "round-robin" fashion, or based on some other parameter such as memory device usage. In response to the selection signal, the multiplexer 40 connects the current source 38 to one of a pair of ports. For example, the control logic 42 can signal the multiplexer 40 to select ports DP1 and DN1, which may correspond to the anode and cathode terminals of thermal diode 20a (FIG. 2), respectively. The control logic 42 then causes the current source 38 to inject the first measurement signal into port DP1. The voltage between port DP1 and port DN1 therefore represents the voltage drop across the thermal diode. The control logic 42 then causes the current source 38 to inject the second measurement signal into port DP1, resulting in a second voltage drop across the thermal diode. The difference between the two voltage drops (e.g., the temperature dependant voltage differential), which can be directly related to the temperature of the thermal diode, is sent to an analog to digital converter (ADC) 44.

In practice, additional circuitry may be used. For example, a low pass filter can be used to remove noise from the differential waveform and a chopper stabilized amplifier can be used to amplify and rectify the differential waveform to produce a direct current (DC) voltage proportional to the differential. Such circuitry has not been illustrated so as not to obscure more relevant aspects of the embodiments of the invention.

The ADC 44 can convert the temperature dependant voltage differential into a digital signal. Thus, each DP port can function as a combined current source and ADC positive input for a thermal diode channel, and each DN port can function as a combined current sink and ADC negative input. The control logic 42 may then proceed to the next pair of ports and the process is repeated. The illustrated SPD device 18' also has a temperature calculation circuit 46 coupled to the ADC 44 to calculate the internal temperatures of the memory devices based on the digital signals.

Figure 4:
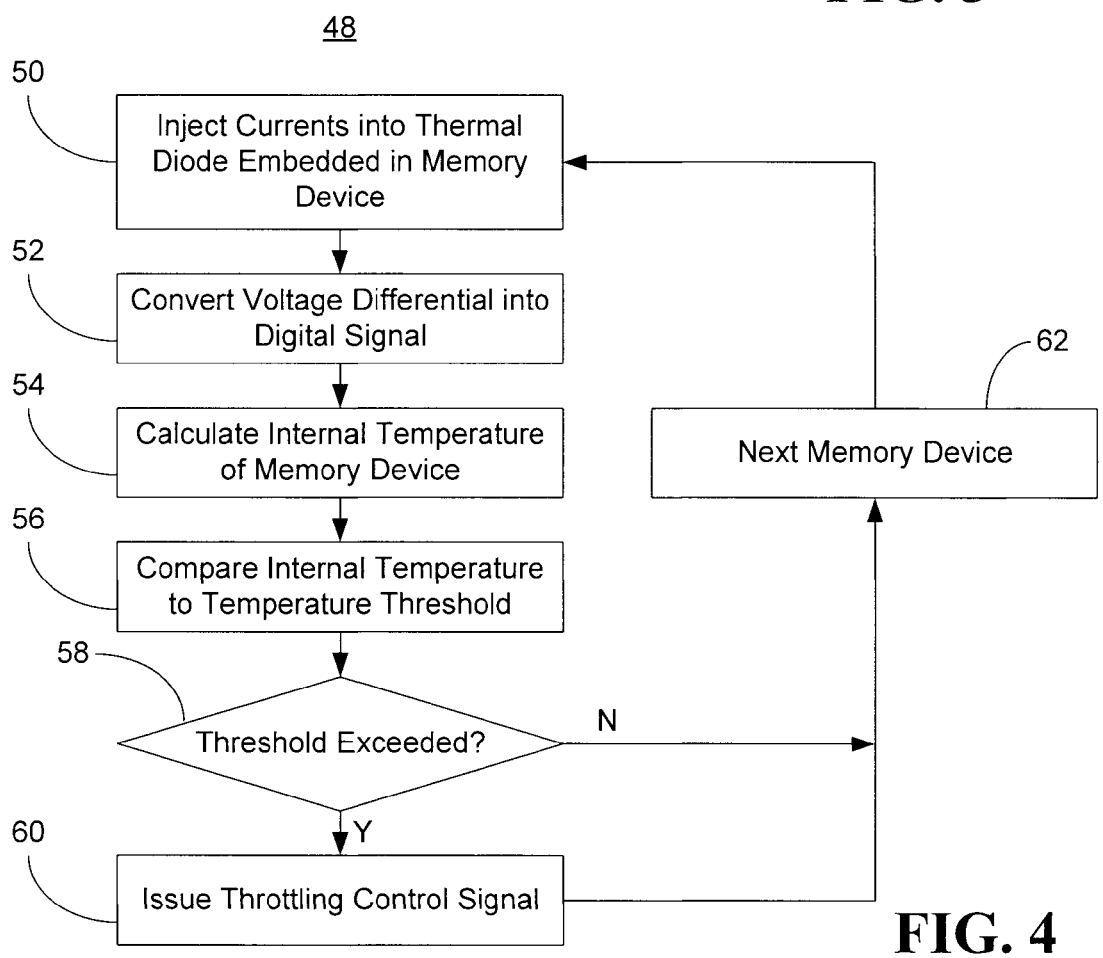
FIG. 4 is a flowchart of an example of a method of managing a memory device according to one embodiment of the invention.

Turning now to FIG. 4, a method 48 of managing a memory device is shown. The method 48 can be implemented in a memory unit using any appropriate hardware and/or software programming technique. For example, the method 48 could be readily incorporated into an application specific integrated circuit (ASIC) of a serial presence detect (SPD) device and/or system controller. Alternatively, the method 48 can be implemented as a set of instructions to be stored in a machine readable memory such as RAM, ROM, flash memory, and so on. The illustrated method 48 provides for injecting a pair of measurement signals into a thermal diode embedded within a memory device at processing block 50. The measurement signals result in a temperature dependent voltage differential for the thermal diode. Block 52 provides for converting the voltage differential into a digital signal and block 54 provides for calculating an internal temperature of the memory device based on the digital signal. The internal temperature is compared to a temperature threshold at block 56, and block 58 provides for determining whether the threshold has been exceeded. If so, a throttling control signal is issued to a memory controller hub at block 60. Otherwise, the next memory device is selected at block 62 and the process is repeated.

Thus, the techniques described herein can be used to significantly improve memory throttling and thermal design power in systems such as servers, desktop PCs, notebook PCs, personal digital assistants (PDAs), wireless "smart" phones, and so on. In particular, the small form factors associated with notebook PCs, PDAs and smart phones particularly lend themselves to the embodiments of the invention. Furthermore, memory structures having relatively high current surge transients that may require immediate shutdown in cases of overheating, can benefit considerably from the principles discussed.

The term "coupled" is used herein to refer to any type of connection, direct or indirect, that enables communication to take place across the interface in question. Thus, coupling might include intermediate components. The coupling might also provide for electronic, electromagnetic, optic and other forms of communication.

Those skilled in the art can appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. An apparatus, comprising:
a module having temperature measurement circuitry to measure a temperature of a memory unit having one or more memory devices, said measuring to be done using a thermal diode and said temperature measurement module including serial presence detect (SPD) circuitry to communicate temperature value information derived from the thermal diode to a controller, wherein the thermal diode provides temperature measurement via a difference between a first measurement signal injected into the thermal diode and a second measurement signal injected into the thermal diode and wherein the thermal diode is embedded within the one or more memory devices.

2. The apparatus of claim 1, wherein the module communicates with a memory controller via an SMBus.

3. The apparatus of claim 1, in which the memory unit is a dual inline memory module (DIMM).

4. The apparatus of claim 3, in which the DIMM is a small outline DIMM (SO-DIMM).

5. A system comprising:
a memory controller;
a bus coupled to the memory controller; and
a plurality of memory units coupled to the controller via the bus, wherein each memory unit has a temperature sensing module to measure a temperature of a memory unit, each module having at least one thermal diode and a serial presence detect (SPD) circuit to communicate temperature value information derived from the thermal diode to the controller, wherein the thermal diode provides temperature measurement via a difference between a first measurement signal injected into the thermal diode and a second measurement signal injected into the thermal diode and wherein the thermal diode is embedded within the memory unit.

6. The system of claim 5, wherein temperature information from a plurality of thermal diodes is communicated to the controller over the bus.

7. The system of claim 6, wherein the bus is an SMBus.

8. The system of claim 6, wherein the bus is an $I^2C$ bus.

9. The system of claim 5, in which the controller is coupled to the plurality of memory units through an I/O controller.

10. The system of claim 5, in which the memory units comprise a plurality of memory devices.

11. The system of claim 10, in which the thermal diode is within at least one of the memory devices for each of the plurality of memory units.

12. A memory unit, comprising:
a plurality of memory devices;
a thermal diode to measure a temperature internal to the memory unit;
a circuit to generate a temperature value using the thermal diode; and
a serial presence detect (SPD) interface to communicate temperature value information with a memory controller, wherein the thermal diode provides temperature measurement via a difference between a first measurement signal injected into the thermal diode and a second measurement signal injected into the thermal diode and wherein the thermal diode is embedded within the memory unit.

13. The memory unit of claim 12, wherein the SPD is to communicate the temperature value to the memory controller.

14. The memory unit of claim 12, in which the thermal diode is embedded within one of the memory devices.

15. The memory unit of claim 13, in which each memory device includes an embedded thermal diode.

\* \* \* \* \*